United States Patent
Beckley et al.

(10) Patent No.: US 10,774,454 B2
(45) Date of Patent: Sep. 15, 2020

(54) USER INTERFACE WITH CAPACITIVE TOUCH SENSOR

(71) Applicant: Haier US Appliance Solutions, Inc., Wilmington, DE (US)

(72) Inventors: Bryan James Beckley, Crestwood, KY (US); S. Neil Malone, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 376 days.

(21) Appl. No.: 15/828,504

(22) Filed: Dec. 1, 2017

(65) Prior Publication Data
US 2019/0169781 A1    Jun. 6, 2019

(51) Int. Cl.
| | |
|---|---|
| D06F 34/28 | (2020.01) |
| D06F 37/06 | (2006.01) |
| D06F 37/30 | (2020.01) |
| D06F 37/40 | (2006.01) |
| D06F 39/14 | (2006.01) |
| D06F 39/08 | (2006.01) |
| D06F 23/02 | (2006.01) |
| H05K 1/18 | (2006.01) |
| G06F 3/044 | (2006.01) |
| D06F 39/02 | (2006.01) |
| H03K 17/96 | (2006.01) |
| D06F 33/00 | (2020.01) |
| G06F 3/0488 | (2013.01) |

(52) U.S. Cl.
CPC .............. *D06F 34/28* (2020.02); *D06F 23/02* (2013.01); *D06F 33/00* (2013.01); *D06F 37/06* (2013.01); *D06F 37/304* (2013.01); *D06F 37/40* (2013.01); *D06F 39/028* (2013.01); *D06F 39/085* (2013.01); *D06F 39/14* (2013.01); *G06F 3/044* (2013.01); *H03K 17/9622* (2013.01); *H05K 1/181* (2013.01); *G06F 3/0488* (2013.01); *H03K 2217/960755* (2013.01); *H05K 2201/10151* (2013.01)

(58) Field of Classification Search
None
See application file for complete search history.

(56) References Cited

U.S. PATENT DOCUMENTS

| | | |
|---|---|---|
| 4,142,378 A | 3/1979 | Bright et al. |
| 6,819,316 B2 | 11/2004 | Schulz et al. |

(Continued)

FOREIGN PATENT DOCUMENTS

| | | | | |
|---|---|---|---|---|
| CN | 1979706 A | 6/2007 | | |
| JP | 2012-003779 A | * 1/2012 | ............. | G06F 3/044 |

(Continued)

OTHER PUBLICATIONS

English machine translation of KR10-2008-0018665.*
English machine translation of JP2012-003779A.*

*Primary Examiner* — Michael E Barr
*Assistant Examiner* — Jason P Riggleman
(74) *Attorney, Agent, or Firm* — Dority & Manning, P.A.

(57) ABSTRACT

A user interface includes a curved outer surface, a generally flat printed circuit board defining a base plane, and a capacitive touch sensor connected to the generally flat printed circuit board and offset from the base plane. The capacitive touch sensor is substantially aligned with the curved outer surface. The user interface may be provided on an appliance.

14 Claims, 7 Drawing Sheets

(56) References Cited

U.S. PATENT DOCUMENTS

| | | | |
|---|---|---|---|
| 9,306,562 B2 * | 4/2016 | Bacaksiz | H03K 17/955 |
| 2011/0148803 A1 | 6/2011 | Xu | |
| 2012/0249467 A1 * | 10/2012 | Kotala | A47L 15/4293 |
| | | | 345/174 |
| 2016/0288462 A1 | 10/2016 | Yin et al. | |

FOREIGN PATENT DOCUMENTS

| | | | | |
|---|---|---|---|---|
| KR | 10-2008-0018665 | * | 2/2008 | D06F 39/00 |
| WO | WO2016123811 A1 | | 8/2016 | |

* cited by examiner

USER INTERFACE WITH CAPACITIVE TOUCH SENSOR

FIELD

The present subject matter relates generally to capacitive touch sensors, such as may be used in control panels for appliances.

BACKGROUND

Appliances generally include a control panel having a plurality of buttons, keys, or other input devices. Utilizing the control panel, an appliance user can input control commands to the appliance and operate the appliance. Certain control panels include capacitive touch sensors that utilize a user's body capacitance to operate. In particular, capacitive touch sensors can detect a change in capacitance when the user touches the control panel.

Capacitive touch sensors have various benefits. For example, capacitive touch sensors can assist with providing a clean appearance for an associated appliance. In particular, capacitive touch sensors are frequently positioned behind a dielectric panel. A user touches an outer surface of the dielectric panel opposite the capacitive touch sensors to actuate the capacitive touch sensors. The smooth outer surface can have a pleasant cosmetic appearance, e.g., particularly compared to tactile buttons, knobs, etc.

Capacitive touch sensors are generally formed on a rigid or semi-rigid printed circuit board, sometimes also referred to as a "PCB." Such printed circuit boards are typically flat, and the capacitive touch sensor or sensors on the PCB must be in a controlled relationship with the outer surface of the dielectric panel. For example, the capacitive touch sensor(s) must be within a particular distance from the outer surface. When the outer surface of the dielectric panel is curved, a flexible PCB may be used so that the PCB can match the shape of the outer surface. However, such flexible printed circuit boards present an increased cost as compared to flat, rigid or semi-rigid printed circuit boards.

Accordingly, capacitive touch sensors that include features for accommodating a curved surface would be useful.

BRIEF DESCRIPTION

The present invention relates to a capacitive touch sensor that has a flat printed circuit board and a curved outer surface, where the printed circuit board includes features that allow the printed circuit board to be flexed to accommodate or correspond to the curvature of the outer surface without causing stress on solder joints of components on the printed circuit board. Additional aspects and advantages of the technology will be set forth in part in the following description, or may be apparent from the description, or may be learned through practice of the technology.

In an exemplary embodiment, a washing machine appliance is provided. The washing machine appliance defines a vertical direction, a lateral direction and a transverse direction that are mutually perpendicular to one another. The washing machine appliance includes a cabinet defining an opening and a tub mounted within the cabinet. The tub is configured for containing fluid during operation of the washing machine appliance. A wash basket is rotatably mounted within the tub. The wash basket defines a wash chamber for receiving articles for washing. The washing machine appliance also includes a user interface disposed on the cabinet. The user interface includes a curved outer surface, a generally flat printed circuit board defining a base plane, and a capacitive touch sensor connected to the generally flat printed circuit board and offset from the base plane. The capacitive touch sensor is substantially aligned with the curved outer surface.

In another exemplary embodiment, a user interface of an appliance is provided. The user interface includes a curved outer surface, a generally flat printed circuit board defining a base plane, and a capacitive touch sensor connected to the generally flat printed circuit board and offset from the base plane. The capacitive touch sensor is substantially aligned with the curved outer surface.

These and other features, aspects and advantages of the present technology will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present technology, including the best mode thereof, directed to one of ordinary skill in the art, is set forth in the specification, which makes reference to the appended figures.

DETAILED DESCRIPTION

Figure 1:
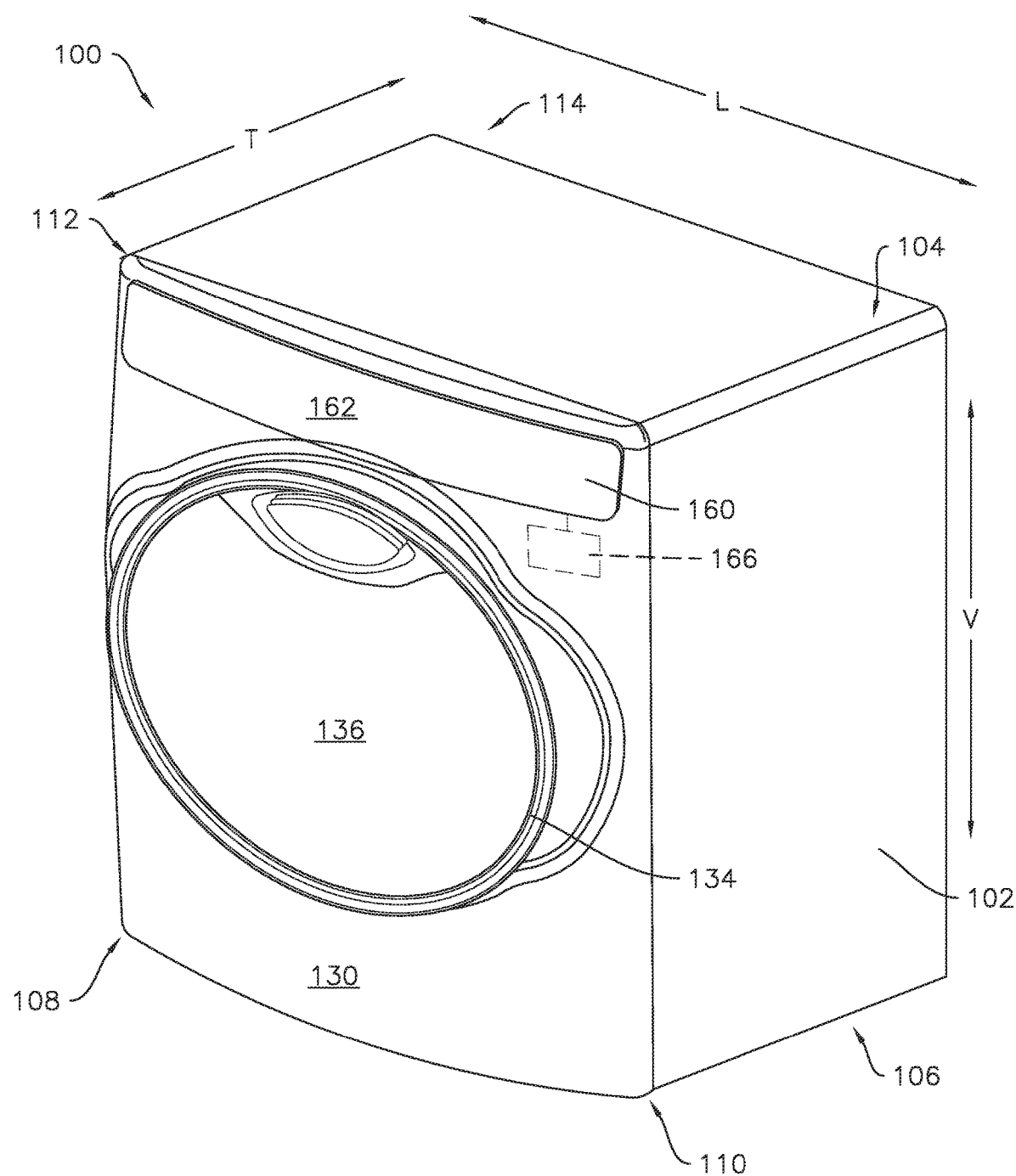
FIG. 1 provides a perspective view of a washing machine appliance as may incorporate a user interface in accordance with at least one embodiment of the present subject matter.

Reference now will be made in detail to embodiments of the technology, one or more examples of which are illustrated in the drawings. Each example is provided by way of explanation of the technology, not limitation of the technology. In fact, it will be apparent to those skilled in the art that various modifications and variations can be made in the present technology without departing from the scope or spirit of the technology. For instance, features illustrated or described as part of one embodiment can be used with another embodiment to yield a still further embodiment. Thus, it is intended that the present technology covers such modifications and variations as come within the scope of the appended claims and their equivalents.

FIG. 1 provides a perspective view of a washing machine appliance 100 according to an exemplary embodiment of the present subject matter. It should be understood that the present disclosure is not limited to washing machine appliances 100, and that any suitable appliance having a user input assembly is within the scope and spirit of the present disclosure.

Figure 2:
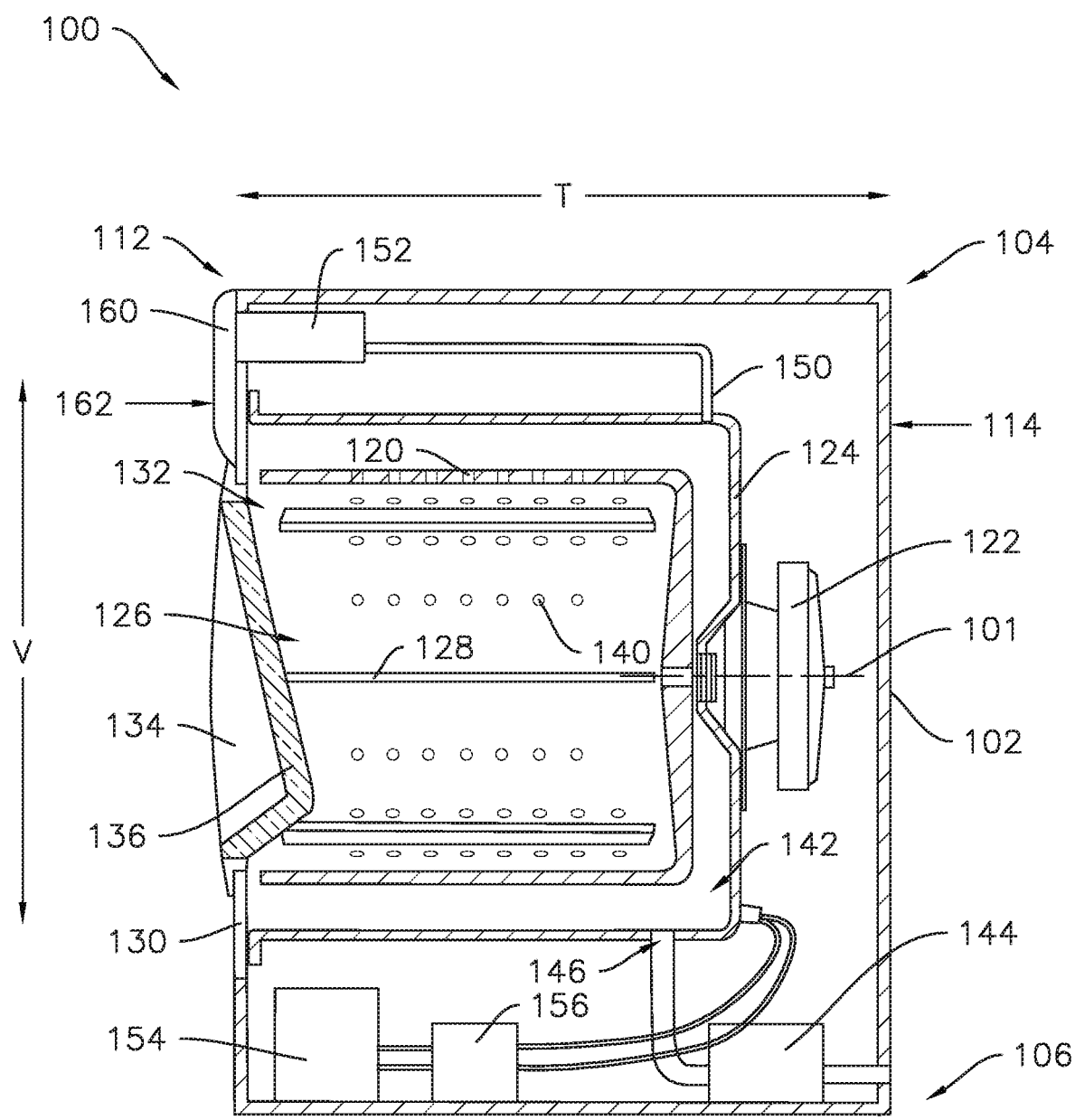
FIG. 2 provides a side cross-sectional view of the exemplary washing machine appliance of FIG. 1.

FIG. 1 is a perspective view of an exemplary washing machine appliance 100 and FIG. 2 is a side cross-sectional view of the washing machine appliance 100. As illustrated, washing machine appliance 100 generally defines a vertical direction V, a lateral direction L, and a transverse direction T, each of which is mutually perpendicular, such that an orthogonal coordinate system is generally defined. Washing machine appliance 100 includes a cabinet 102 that extends between a top 104 and a bottom 106 along the vertical direction V, between a left side 108 and a right side 110 along the lateral direction L, and between a front 112 and a rear 114 along the transverse direction T.

As illustrated in FIG. 2, a wash tub 124 is mounted within cabinet 102. A wash basket 120 is received within the wash tub 124 and the wash basket 120 defines a wash chamber 126 that is configured for receipt of articles for washing. Wash basket 120 is rotatably mounted within cabinet 102, e.g., within wash tub 124, such that wash basket 120 is rotatable about an axis of rotation 101. A motor 122, e.g., such as a pancake motor, is in mechanical communication with wash basket 120 to selectively rotate wash basket 120 (e.g., during an agitation or a rinse cycle of washing machine appliance 100) about the axis 101. In the example embodiment illustrated by FIG. 2, the axis 101 may be oriented generally along or parallel to the transverse direction T of the washing machine appliance 100. Accordingly, the washing machine appliance 100 may be referred to as a horizontal axis washing machine.

The wash tub 124 holds wash and rinse fluids for agitation in wash basket 120 within wash tub 124. As used herein, "wash fluid" may refer to water, detergent, fabric softener, bleach, or any other suitable wash additive or combination thereof.

Wash basket 120 may define one or more agitator features that extend into wash chamber 126 to assist in agitation and cleaning of articles disposed within wash chamber 126 during operation of washing machine appliance 100. For example, as illustrated in FIG. 2, a plurality of ribs 128 extends from basket 120 into wash chamber 126. In this manner, for example, ribs 128 may lift articles disposed in wash basket 120 during rotation of wash basket 120.

Referring generally to FIGS. 1 and 2, cabinet 102 also includes a front panel 130 which defines an opening 132 that permits user access to wash basket 120 within wash tub 124. More specifically, washing machine appliance 100 includes a door 134 that is positioned in front of opening 132 and is rotatably mounted to front panel 130. Door 134 is rotatable such that door 134 permits selective access to opening 132 by rotating between an open position (not shown) facilitating access to a wash tub 124 and a closed position (FIG. 1) prohibiting access to wash tub 124.

A window 136 in door 134 permits viewing of wash basket 120 when door 134 is in the closed position, e.g., during operation of washing machine appliance 100. Door 134 also includes a handle (not shown) that, e.g., a user may pull when opening and closing door 134. Further, although door 134 is illustrated as mounted to front panel 130, it should be appreciated that door 134 may be mounted to another side of cabinet 102 or any other suitable support according to alternative embodiments.

Referring again to FIG. 2, wash basket 120 also defines a plurality of perforations 140 in order to facilitate fluid communication between an interior of basket 120 and wash tub 124. A sump 142 is defined by wash tub 124 at a bottom of wash tub 124 along the vertical direction V. Thus, sump 142 is configured for receipt of and generally collects wash fluid during operation of washing machine appliance 100. For example, during operation of washing machine appliance 100, wash fluid may be urged by gravity from basket 120 to sump 142 through plurality of perforations 140. A pump assembly 144 is located beneath tub 124 for gravity assisted flow when draining tub 124, e.g., via a drain 146. Pump assembly 144 may be configured for recirculating wash fluid within wash tub 124.

A spout 150 is configured for directing a flow of fluid into wash tub 124. For example, spout 150 may be in fluid communication with a water supply (not shown) in order to direct fluid (e.g., clean water) into wash tub 124. Spout 150 may also be in fluid communication with the sump 142. For example, pump assembly 144 may direct wash fluid disposed in sump 142 to spout 150 in order to circulate wash fluid in wash tub 124.

As illustrated in FIG. 2, a detergent drawer 152 is slidably mounted within front panel 130. Detergent drawer 152 receives a wash additive (e.g., detergent, fabric softener, bleach, or any other suitable liquid or powder) and directs the fluid additive to wash chamber 124 during operation of washing machine appliance 100. According to the illustrated embodiment, detergent drawer 152 may also be fluidly coupled to spout 150 to facilitate the complete and accurate dispensing of wash additive.

Additionally, a bulk reservoir 154 is disposed within cabinet 102. Bulk reservoir 154 is also configured for receipt of fluid additive for use during operation of washing machine appliance 100 (shown in FIG. 1). Bulk reservoir 154 is sized such that a volume of fluid additive sufficient for a plurality or multitude of wash cycles of washing machine appliance 100 (e.g., five, ten, twenty, fifty, or any other suitable number of wash cycles) may fill bulk reservoir 154. Thus, for example, a user can fill bulk reservoir 154 with fluid additive and operate washing machine appliance 100 for a plurality of wash cycles without refilling bulk reservoir 154 with fluid additive. A reservoir pump 156 is configured for selective delivery of the fluid additive from bulk reservoir 154 to wash tub 124.

During operation of washing machine appliance 100, laundry items are loaded into wash basket 120 through opening 132. Wash tub 124 is filled with water, detergent, and/or other fluid additives, e.g., via spout 150 and/or detergent drawer 152. One or more valves (not shown) can be controlled by washing machine appliance 100 to provide for filling wash basket 120 to the appropriate level for the amount of articles being washed and/or rinsed. By way of example for a wash mode, once wash basket 120 is properly filled with fluid, the contents of wash basket 120 can be agitated (e.g., with ribs 128) for washing of laundry items in wash basket 120.

After the agitation phase of the wash cycle is completed, wash tub 124 can be drained. Laundry articles can then be rinsed by again adding fluid to wash tub 124, depending on the particulars of the cleaning cycle selected by a user. Ribs 128 may again provide agitation within wash basket 120. One or more spin cycles may also be used. In particular, a spin cycle may be applied after the wash cycle and/or after the rinse cycle in order to wring wash fluid from the articles being washed. During a spin cycle, basket 120 is rotated at relatively high speeds. After articles disposed in wash basket 120 are cleaned and/or washed, the user can remove the articles from wash basket 120, e.g., by opening door 134 and reaching into wash basket 120 through opening 132.

A control panel 160 is coupled to front panel 130. Control panel 160 defines an outer surface 162. The control panel 160 and outer surface 162 may be part of a user interface 200 (FIG. 3) for operator selection of machine cycles and features. As one example of such user interface, the control panel 160 may be used as part of a capacitive touch sensing system to allow for the selective activation, adjustment, or control of the washing machine appliance 100. In such embodiments, the control panel 160 may be the dielectric panel of the capacitive touch system whereby the capacitive touch system registers touches on the outer surface 162. The user interface 200 may also provide for the selective activation, adjustment, or control of any timer features or other user-adjustable inputs. One or more of a variety of electrical, mechanical or electromechanical input devices including rotary dials, push buttons, toggle/rocker switches, and/or touch pads can also be used singularly or in combination with touch input components. Control panel 160 may also include a display component, such as a digital or analog display device designed to provide operational feedback to a user.

Also, although described with respect to washing machine appliance 100, it should be readily understood that a user interface as described herein could be used with any suitable appliance. When used with other appliances, such as, e.g., dryer appliances, cooking appliances, and/or refrigerator appliances, panel 160 may be constructed of glass, ceramics, plastics, and/or combinations thereof. Suitable plastic materials may include acrylics, polyethylene terephthalate ("PET"), or the like. In some embodiments, a touch screen may be incorporated into or may form the control panel of an appliance; for example, the touch screen may be incorporated into a backsplash of a cooktop or dryer appliance.

Operation of washing machine appliance 100 can be regulated by a controller 166 that is operatively coupled, i.e., in communication with, user interface 200. By way of example, the controller may include a memory and one or more processing devices such as microprocessors, CPUs or the like, such as general or special purpose microprocessors operable to execute programming instructions or microcontrol code associated with operation of appliance 100. The memory may represent random access memory such as DRAM, or read only memory such as ROM or FLASH. The memory may be a separate component from the processor or may be included onboard within the processor. In one embodiment, the processor executes programming instructions stored in memory. It should be noted that controllers 166 as disclosed herein are capable of and may be operable to perform any methods and associated method steps as disclosed herein. For example, in some embodiments, methods disclosed herein may be embodied in programming instructions stored in the memory and executed by the controller 166.

The controller 166 may be positioned in a variety of locations throughout washing machine appliance 100. In the illustrated embodiment, e.g., as shown in FIG. 1, the controller may be located under or next to the control panel 160. In such an embodiment, input/output ("I/O") signals are routed between the controller and various operational components of appliance 100 such as control panel 160, sensors, graphical displays, and/or one or more alarms. In one embodiment, the control panel 160 may represent a general purpose I/O ("GPIO") device or functional block. Control panel 160 may be in communication with the controller via one or more signal lines or shared communication busses. A user of washing machine appliance 100 may input and receive information regarding the operation of washing machine 100 at control panel 160. A variety of text, digits, and/or symbols may be printed on control panel 160. In some embodiments, no text, digits, or symbols may appear on control panel 160 unless washing machine appliance 100 is in use.

Figure 3:
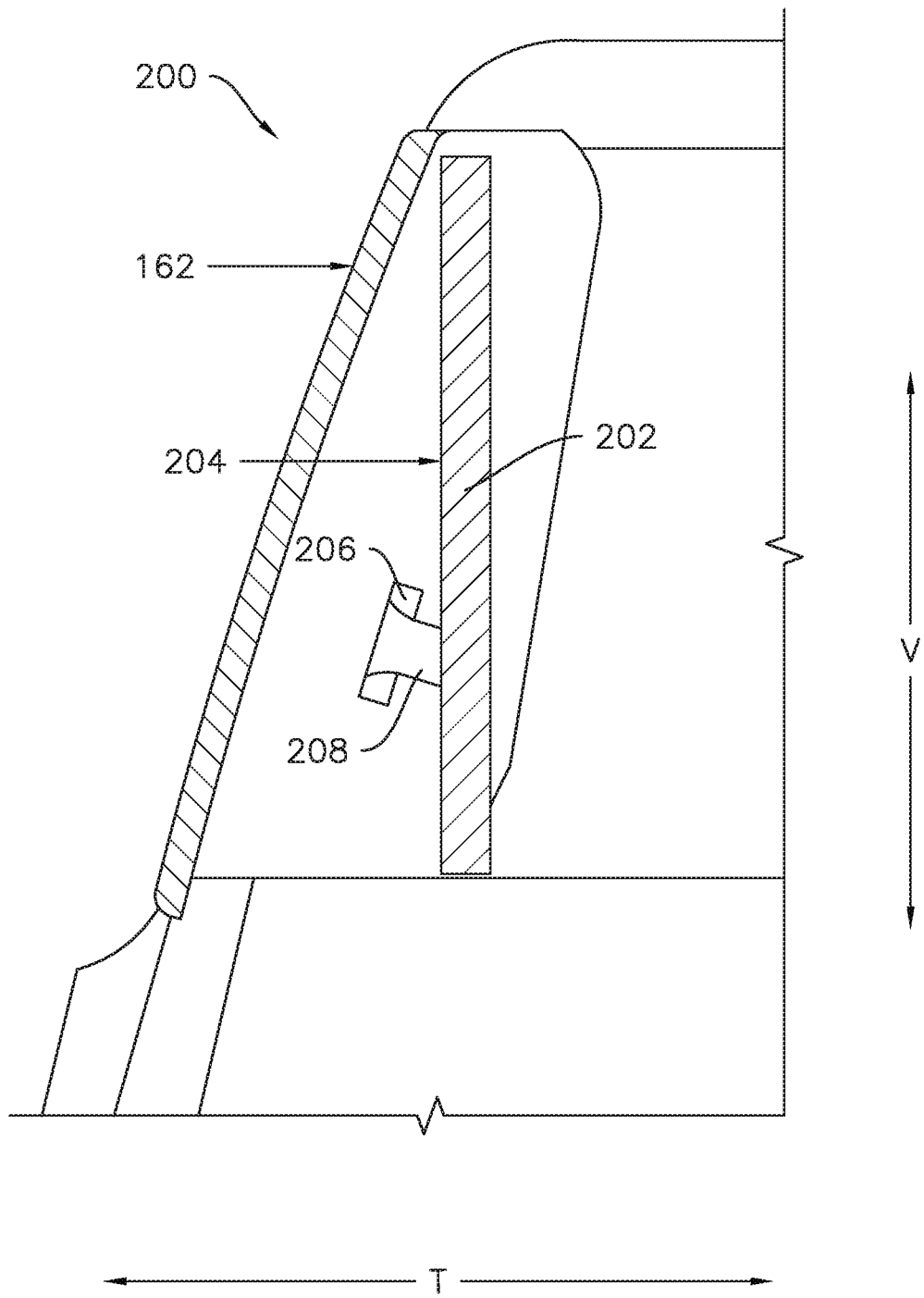
FIG. 3 provides a side section view of the user interface assembly of the washing machine appliance of FIGS. 1 and 2.

As shown in FIG. 3, a printed circuit board 202 is positioned behind control panel 160 along the transverse direction T. The printed circuit board 202 may include a capacitive touch sensor 206, whereby washing machine appliance 100 is controlled at least in part through touch inputs on control panel 160, and more particularly on outer surface 162 thereof, by a user of washing machine appliance 100.

Figure 4:
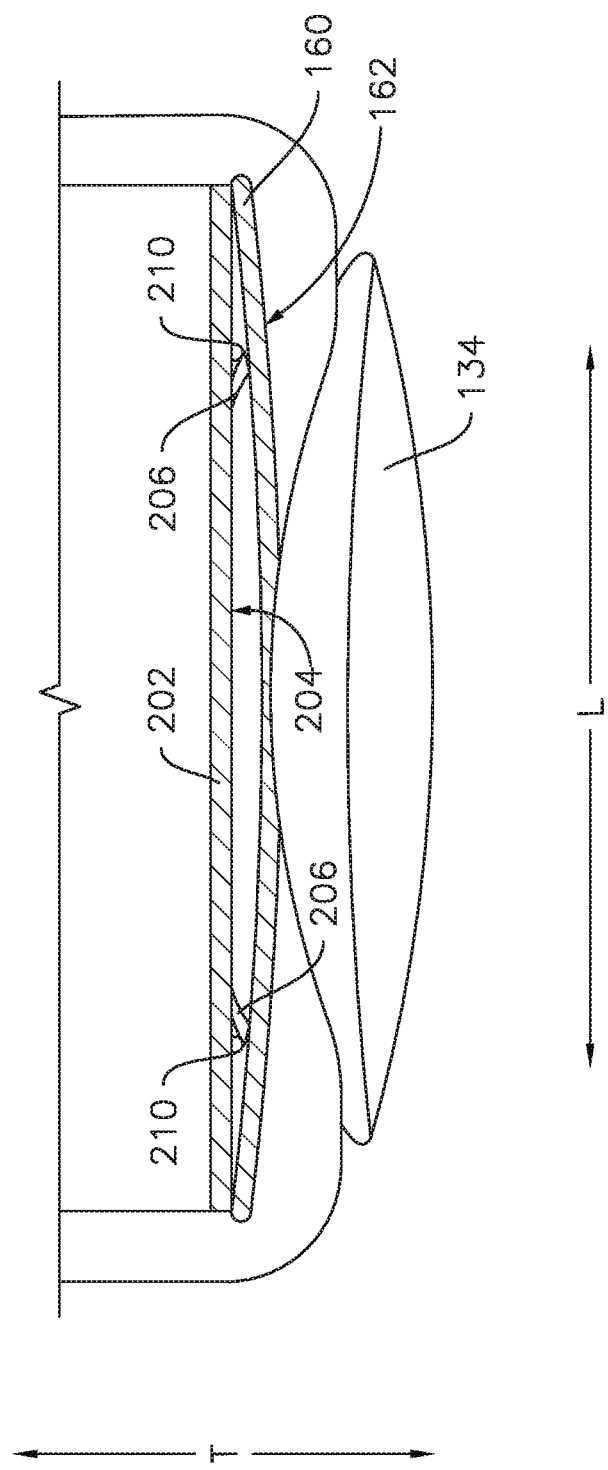
FIG. 4 provides a top-down section view of the user interface assembly of the washing machine appliance of FIGS. 1 and 2.

As may be seen in FIGS. 3 and 4, the outer surface 162 may be a curved outer surface. For example, as shown in FIG. 3, the curved outer surface 162 may define a curve in a vertical-transverse plane. Another example is shown in FIG. 4, where the curved outer surface 162 defines a curve in a lateral-transverse plane. In some embodiments, the curved outer surface 162 may have a compound curvature, e.g., the curved outer surface 162 may define a first curve in a lateral-transverse plane and a second curve in a vertical-transverse plane.

The printed circuit board 202 may be generally flat and may define a base plane 204. The printed circuit board 202 may include one or more capacitive touch sensors 206 connected to the generally flat printed circuit board 202 and offset from the base plane 204. In particular embodiments, the capacitive touch sensor 206 may be offset from the base plane 204 such that the capacitive touch sensor 206 is substantially aligned with the curved outer surface 162. As used herein, terms of approximation, such as "generally," "substantially," or "about" include values within ten percent greater or less than the stated value. In the context of an angle or direction, such terms may include within about ten degrees greater or less than the stated angle or direction. In particular with respect to the capacitive touch sensor 206 substantially aligned with the curved outer surface 162, the capacitive touch sensor 206 may, for example, be substantially aligned with the curved outer surface 162 such that a required gap between the curved outer surface 162 and the capacitive touch sensor 206 is maintained which permits the capacitive touch sensor 206 to detect a change in capacitance based on the presence of, e.g., a user's finger on the curved outer surface 162.

Figure 5:
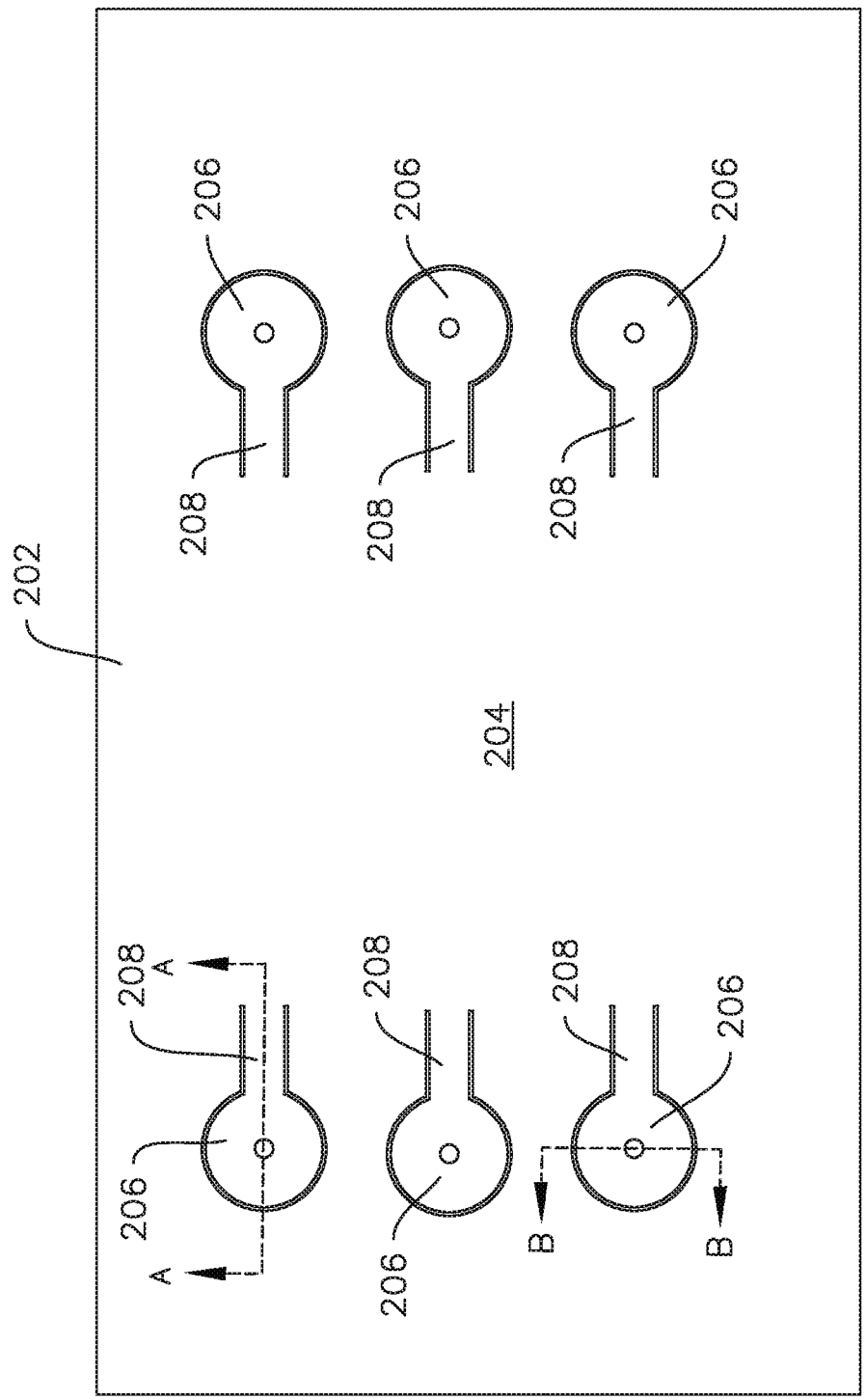
FIG. 5 provides a view of a printed circuit board including an array of capacitive touch sensors in accordance with at least one embodiment of the present subject matter.

As may be seen, e.g., in FIG. 5, the capacitive touch sensor 206 may be connected to the generally flat printed circuit board 202 by a stem 208. The capacitive touch sensor 206 and the stem 208 may be integral with the generally flat printed circuit board 202. For example, the capacitive touch sensor 206 and the stem 208 may be formed from the generally flat printed circuit board 202, e.g., by partially cutting out the capacitive touch sensor 206 and the stem 208 from the generally flat printed circuit board 202. In various embodiments, the capacitive touch sensor 206, the stem 208, and the generally flat printed circuit board 202 may form a continuous and unitary structure. For example, the capacitive touch sensor 206 may be cantilevered from the generally flat printed circuit board 202, e.g., as illustrated in FIG. 6, where the stem 208 extends continuously between the capacitive touch sensor 206 and the generally flat printed circuit board 202, such that the capacitive touch sensor 206 is connected to and cantilevered from the generally flat printed circuit board 202 by the stem 208.

The stem 208 is flexed to accommodate the offset of the capacitive touch sensor 206 from the generally flat printed circuit board 202 towards the curved outer surface 162. Thus, the material of the stem 208 is flexed. The generally flat printed circuit board 202 may be advantageously configured such that no components of the generally flat printed circuit board 202 are disposed on, e.g., soldered to, the stem 208. Such configuration advantageously permits a portion of the generally flat printed circuit board 202, e.g., the stem 208, to be flexed without causing stress on solder joints of components.

Figure 6:
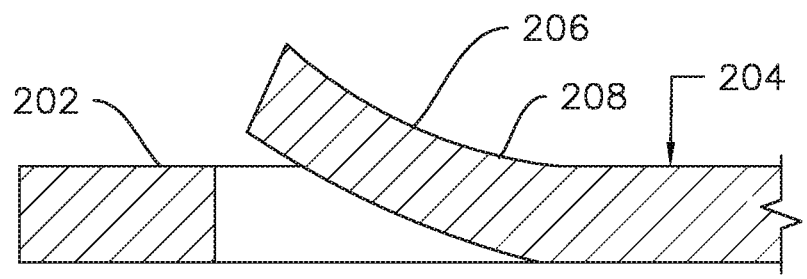
FIG. 6 provides a section view of a capacitive touch sensor in accordance with at least one embodiment of the present subject matter taken along line A-A in FIG. 5.
Figure 7:
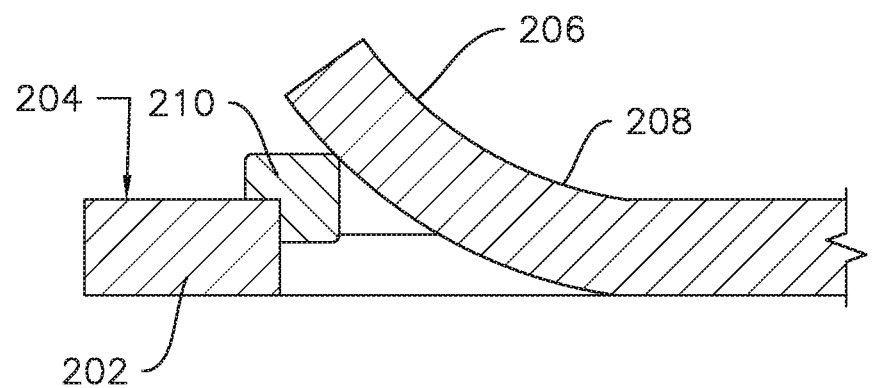
FIG. 7 provides a section view of a capacitive touch sensor in accordance with at least one embodiment of the present subject matter taken along line A-A in FIG. 5.
Figure 8:
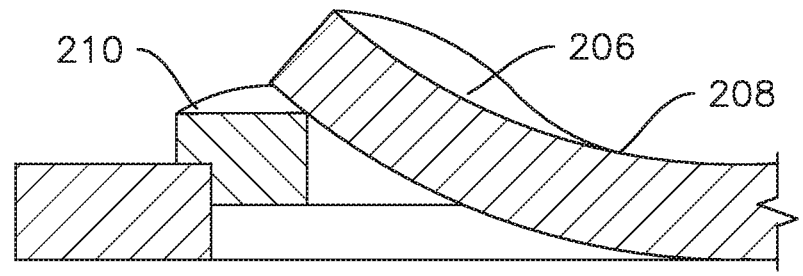
FIG. 8 provides a section view of a capacitive touch sensor in accordance with at least one embodiment of the present subject matter taken along line A-A in FIG. 5.
Figure 9:
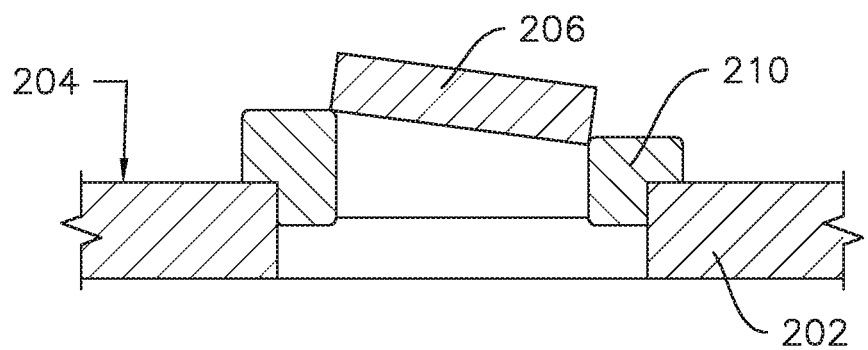
FIG. 9 provides a section view of a capacitive touch sensor in accordance with at least one embodiment of the present subject matter taken along line B-B in FIG. 5.

As illustrated in FIGS. 6 through 9, the stem 208 may be curved similarly or corresponding to the curvature of the curved outer surface 162 in order to position the capacitive touch sensor 206 in a desired location proximate to the curved outer surface 162 to permit the capacitive touch sensor 206 to register touches thereon. For example, as illustrated in FIGS. 6 and 7, the stem 108 may define a curve in a lateral-transverse plane, e.g., when the generally flat printed circuit board 202 is positioned and oriented as shown in FIG. 4. In additional example embodiments, such as is illustrated in FIGS. 8 and 9, the stem 208 may define a first curve in a lateral-transverse plane and a second curve in a vertical-transverse plane (e.g., when the generally flat printed circuit board 202 is positioned and oriented as shown in FIGS. 3 and 4).

The capacitive touch sensor 206 and the stem 208 may be held in place by for example, fasteners such as screws or pins. In some embodiments, e.g., as shown in FIGS. 7 through 9, a shim or spacer 210 may be provided between the generally flat printed circuit board 202 and the capacitive touch sensor 206. The shim 210 may be formed of any suitable material. For example, the shim 210 may be formed of any resilient and electrically insulative material, such as plastic.

While described in the context of a specific embodiment of horizontal axis washing machine appliance 100, using the teachings disclosed herein it will be understood that horizontal axis washing machine appliance 100 is provided by way of example only. Other washing machine appliances having different configurations, different appearances, and/or different features may also be utilized with the present subject matter as well.

It should be understood that the present disclosure is not limited to the above-described user interface assembly 200. Additionally, it should be understood that the descriptions herein of an appliance are but one example of a possible field of use for the capacitive touch sensors and related methods.

This written description uses examples to disclose the technology, including the best mode, and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A washing machine appliance defining a vertical direction, a lateral direction and a transverse direction that are mutually perpendicular to one another, the washing machine appliance comprising:
   a cabinet defining an opening;
   a tub mounted within the cabinet and configured for containing fluid during operation of the washing machine appliance;
   a wash basket rotatably mounted within the tub, the wash basket defining a wash chamber for receiving articles for washing; and
   a user interface disposed on the cabinet, the user interface comprising:
      a curved outer surface;
      a generally flat printed circuit board defining a base plane; and
      a capacitive touch sensor connected to the generally flat printed circuit board and offset from the base plane, the capacitive touch sensor substantially aligned with the curved outer surface;
      wherein the capacitive touch sensor is connected to the generally flat printed circuit board by a stem; the capacitive touch sensor, the generally flat printed circuit board, and the stem comprising a continuous and unitary structure, and wherein the stem defines a first curve in a lateral-transverse plane and a second curve in a vertical-transverse plane.

2. The washing machine appliance of claim 1, wherein the curved outer surface defines a curve in one of a lateral-transverse plane and a vertical-transverse plane.

3. The washing machine appliance of claim 2, wherein the curved outer surface defines a curve in the lateral-transverse plane.

4. The washing machine appliance of claim 2, wherein the curved outer surface defines a curve in the vertical-transverse plane.

5. The washing machine appliance of claim 1, wherein the curved outer surface defines a first curve in a lateral-transverse plane and a second curve in a vertical-transverse plane.

6. The washing machine appliance of claim 1, further comprising a shim between the generally flat printed circuit board and the capacitive touch sensor.

7. The washing machine appliance of claim 1, wherein the capacitive touch sensor is cantilevered from the generally flat printed circuit board.

8. A user interface of an appliance defining a vertical direction, a lateral direction and a transverse direction that are mutually perpendicular to one another, the user interface comprising:
   a curved outer surface;
   a generally flat printed circuit board defining a base plane; and
   a capacitive touch sensor connected to the generally flat printed circuit board and offset from the base plane, the capacitive touch sensor substantially aligned with the curved outer surface;
   wherein the capacitive touch sensor is connected to the generally flat printed circuit board by a stem; the capacitive touch sensor, the generally flat printed circuit board, and the stem comprising a continuous and unitary structure, and wherein the stem defines a first curve in a lateral-transverse plane and a second curve in a vertical-transverse plane.

9. The user interface of claim 8, wherein the curved outer surface defines a curve in one of a lateral-transverse plane and a vertical-transverse plane.

10. The user interface of claim 9, wherein the curved outer surface defines a curve in the lateral-transverse plane.

11. The user interface of claim 9, wherein the curved outer surface defines a curve in the vertical-transverse plane.

12. The user interface of claim 8, wherein the curved outer surface defines a first curve in a lateral-transverse plane and a second curve in a vertical-transverse plane.

13. The user interface of claim 8, further comprising a shim between the generally flat printed circuit board and the capacitive touch sensor.

14. The user interface of claim 8, wherein the capacitive touch sensor is cantilevered from the generally flat printed circuit board.

* * * * *